(12) United States Patent
Tu

(10) Patent No.: US 7,304,540 B2
(45) Date of Patent: Dec. 4, 2007

(54) SOURCE FOLLOWER AND CURRENT FEEDBACK CIRCUIT THEREOF

(75) Inventor: Chuan-Ping Tu, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 120 days.

(21) Appl. No.: 11/300,988

(22) Filed: Dec. 15, 2005

(65) Prior Publication Data

US 2006/0132240 A1 Jun. 22, 2006

(30) Foreign Application Priority Data

Dec. 16, 2004 (TW) .............................. 93139232 A

(51) Int. Cl.
*H03F 1/30* (2006.01)
(52) U.S. Cl. ....................... 330/290; 330/285; 330/288
(58) Field of Classification Search ................ 330/290, 330/285, 288
See application file for complete search history.

(56) References Cited

U.S. PATENT DOCUMENTS

| | | | | |
|---|---|---|---|---|
| 4,532,477 A | * | 7/1985 | Green et al. ................. | 330/149 |
| 4,912,431 A | * | 3/1990 | Duijves ....................... | 330/300 |
| 5,691,663 A | * | 11/1997 | Nayebi et al. .............. | 327/560 |
| 6,046,642 A | * | 4/2000 | Brayton et al. ............. | 330/296 |
| 6,434,243 B1 | * | 8/2002 | Read ........................... | 381/120 |
| 7,113,043 B1 | * | 9/2006 | Jin et al. ..................... | 330/279 |

* cited by examiner

*Primary Examiner*—Patricia Nguyen
(74) *Attorney, Agent, or Firm*—Winston Hsu

(57) ABSTRACT

A current feedback circuit is used in the source follower. The source follower includes a first MOS transistor and a current mirror. The first MOS transistor has a gate receiving an inputting signal and a source outputting an output signal. A drain current flows through the first MOS transistor. The current mirror generates the drain current according to an adding current. The current feedback circuit is used for stabilizing the drain current to a constant value substantially. The current feedback circuit includes a passive component and an operational amplifier. The passive component has a first end and a second end, which has an error voltage when a corresponding current flows through the passive component. The magnitude of the corresponding current changes with the magnitude of the drain current. The operational amplifier outputs a reference signal to adjust the adding current according to the error voltage and a reference voltage.

13 Claims, 3 Drawing Sheets

SOURCE FOLLOWER AND CURRENT FEEDBACK CIRCUIT THEREOF

This application claims the benefit of Taiwan application Serial No. 93139232, filed Dec. 16, 2004, the subject matter of which is incorporated herein by reference.

BACKGROUND OF THE INVENTION

1. Field of the Invention

The invention relates in general to a source follower, and more particularly to a source follower and current feedback circuit thereof.

2. Description of the Related Art

Source follower is a widely applied circuit nowadays. As shown in FIG. 1, the source follower 100 includes a current source Is, an N-type metal oxide semiconductor (NMOS) transistor M1, a NMOS transistor M2, and a NMOS transistor Mp. A current I1 flows through the NMOS transistors M2 and Mp. Owing that NMOS transistors are influenced by channel length modulation effect, the current I1 is not stable as ideal, thereby influencing the output signal Vout. For example, when the input signal Vin varies, the output signal Vout will have the same phase change with the input signal Vin. When the output signal Vout varies, the drain voltage of the NMOS transistor M2 and thus the voltage drop between the drain and the source of the NMOS transistor M2 will change accordingly. Therefore, due to the channel length modulation effect, the current I1 flowing through the NMOS transistor M2 will not be stable. Because the current I1 change causes variation of the voltage drop (Vgs) between the gate and the source of the NMOS transistor Mp, that is, the voltage difference between the input signal Vin and the output signal Vout, the input signal Vin cannot vary synchronously with the output signal Vout, thereby resulting in signal distortion of the output signal Vout.

In order to solve the signal distortion issue, conventionally, a current mirror composed of a P-type metal oxide semiconductor (PMOS) transistor M3 and a PMOS transistor M4 are added to the original circuit to stabilize the current I2 by way of feedback and thus to prevent distortion of the output signal Vout. However, this will lower down the operational voltage of the miniaturized integrated circuit. Therefore, the voltage drop between the source and the gate of the PMOS transistor M4 as shown in FIG. 2 may cause the NMOS transistors Mp and M2 unable to operate normally and thus the source follower 200 has no function.

SUMMARY OF THE INVENTION

It is therefore an object of the invention to provide a source follower using a current feedback circuit to prevent distortion of the output signal.

The invention achieves the above-identified object by providing a current feedback circuit applied in a source follower. The source follower includes a transistor having a first electrode, a second electrode, and a third electrode. The first electrode receives an input signal, the second electrode outputs an output signal according to the input signal, and a current of the source follower flows through the transistor. The current feedback circuit includes a first impedance and a comparator. The first impedance is coupled to the third electrode to form a node for receiving an operational voltage. The current of the source follower flows through the impedance and the node outputs an error voltage. The comparator is coupled to the first impedance for outputting a compared signal according to the error voltage and a reference voltage. The source follower adjusts the current of the source follower according to the compared signal.

The invention achieves the above-identified object by providing a source follower including a transistor, an impedance, and a comparator. The transistor includes a first electrode, a second electrode, and a third electrode. The first electrode receives an input signal, the second electrode outputs an output signal according to the input signal, and a drain current flows by the transistor. The impedance is coupled to the third electrode to form a first node. The drain current flows through the impedance and the first node outputs an error voltage corresponding to the drain current. The comparator is coupled to the impedance for comparing the error voltage with a reference voltage and thereby outputting a reference current. The feedback circuit is for feeding back the reference signal to the source follower. The source follower adjusts the drain current according to the reference signal.

The invention achieves the above-identified object by a method for receiving an input signal and thereby outputting an output signal. The method includes receiving the input signal by a gate of a transistor, and thereby outputting the output signal according to the input signal by a source of the transistor, wherein a drain current flows through the transistor; generating an error voltage which is corresponding to the drain current and an impendence; comparing the error voltage with a reference voltage and thereby outputting a reference signal; and adjusting the drain current according to the reference signal. The error voltage is corresponding to a voltage provided by the voltage source and magnitude of the first impedance and the current of the source follower.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
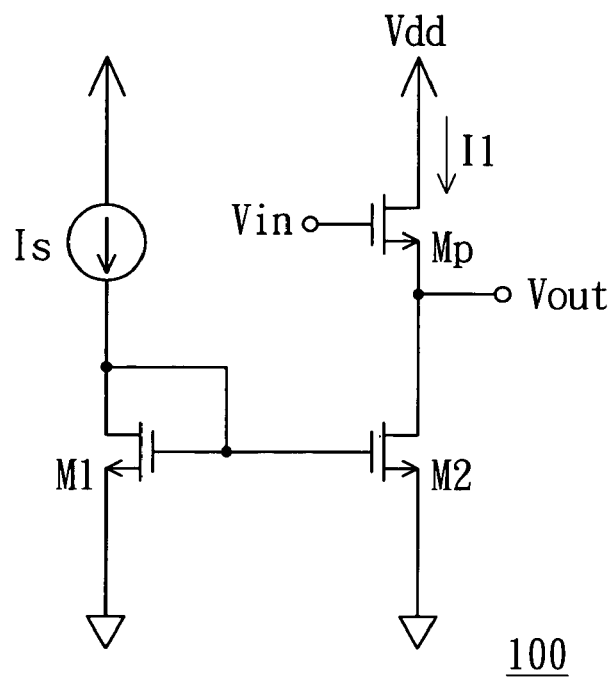
FIG. 1 is a circuit diagram of a first conventional source follower.
Figure 2:
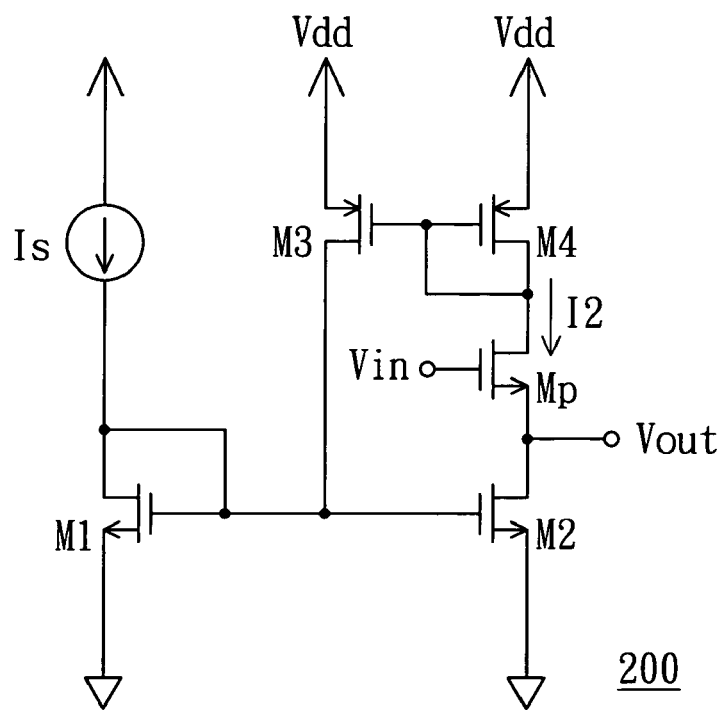
FIG. 2 is a circuit diagram of a second conventional source follower.
Figure 3:
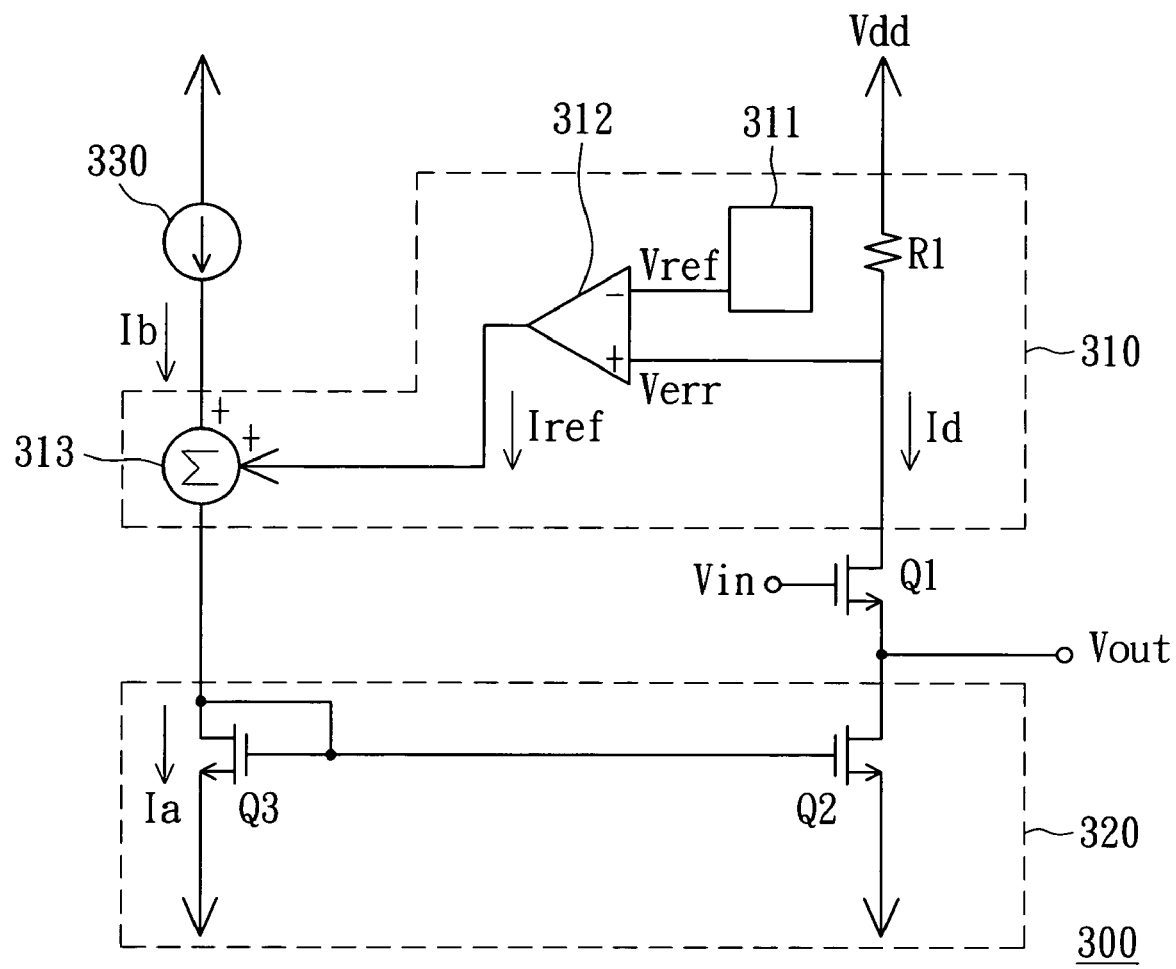
FIG. 3 is a circuit diagram of a source follower according to a preferred embodiment of the invention.

Referring to FIG. 3, a circuit diagram of a source follower according to a preferred embodiment of the invention is shown. The source follower 300 includes a NMOS transistor, a current feedback circuit 310, and a current mirror 320. The NMOS transistor has a gate for receiving an input signal Vin, and a source for outputting an output signal Vout. The current mirror substantially stabilizes the drain current Id of the NMOS transistor Q1 to prevent distortion of the output signal Vout according to a signal outputted by the current feedback circuit 310.

The current feedback circuit 310 includes a resistor R1, an operational amplifier 312, a reference voltage generator 311, and an adder 313. The resistor R1 has a first terminal coupled to a high-level voltage Vdd and a second terminal coupled to the drain of the NMOS transistor Q1 and the operational amplifier 312. The second terminal has an error voltage Verr equal to the difference of the voltage Vdd and the voltage drop at the resistor R1 caused by the drain current Id, that is, Verr=Vdd−Id×R1. The operational amplifier 312 has a positive input terminal (+) for receiving the error voltage Verr, and a negative input terminal (−) for receiving a reference voltage Vref. The reference voltage Vref is an ideal voltage at the drain of the NMOS transistor Q1 corresponding to a specific drain current Id. The operational amplifier 312 outputs the reference current Iref according to the error voltage Verr and the reference voltage Vref. The adder 313 sums up the reference current Iref and an active current Ib output by the current source 330 and accordingly outputs an adding current Ia to the drain of a NMOS transistor Q3 of the current mirror 320.

The circuit devices, such as the operational amplifier 312 and the adder 313 mentioned above, can be replaced with an equivalent comparator and controller. According to the invention, the alternatives are still within the scope and spirit of the invention since the comparator is used to compare the error voltage and the reference voltage to output a compared signal, and the drain current is adjusted according to the compared signal.

Figure 4:
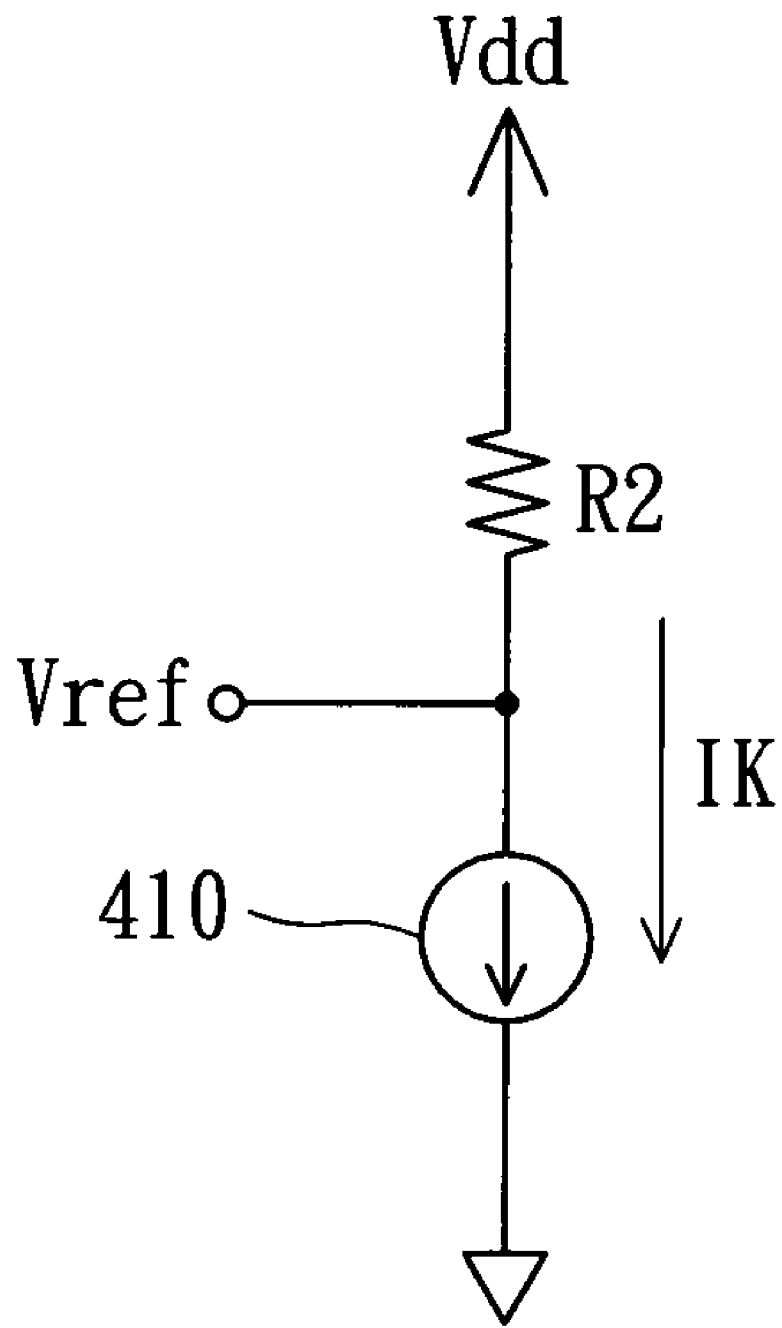
FIG. 4 is a circuit diagram of a reference voltage generator in FIG. 3.

The reference voltage generator 311 is used for generating the reference voltage Vref. Referring to FIG. 4, a circuit diagram of a reference voltage generator 311 in FIG. 3 is shown. The reference voltage generator 311 includes a resistor R2 and a current source 410 for providing a current Ik. The resistor R2 has one end coupled to the high-level voltage Vdd, and the other end coupled to the current source 410 and the negative terminal of the operational amplifier 312 for outputting the reference voltage Vref. The current flowing through the resistor R2 is Ik, so the reference voltage Vref is equal to the difference between the voltage Vdd and the voltage drop of the resistor R2 caused by the current Ik, that is, Vref=Vdd−Ik×R2. The reference voltage generator 311 generates the reference voltage Vref by controlling the value of resistor R2 and current Ik. In consideration of power saving (power $P=I^2 \times R$), it can be achieved by reducing the current Ik, that is, increasing the value of resistor R2 in the condition that the reference voltage Vref remains constant. Therefore, the reference voltage generator 311 can be designed in accordance with this power saving purpose. It is noted that the reference voltage generator 311 can be implemented by many other ways in terms of one who is familiar with the related arts. For example, the current source 410 can be replaced with a resistor. Therefore, the above-mentioned reference voltage generator 311 is only an embodiment of the invention, but the invention is not limited thereto.

The current mirror 320 includes a NMOS transistor Q2 and a NMOS transistor Q3. The drain of the NMOS transistor Q2 is coupled to the source of the NMOS transistor Q1 while the gate of the NMOS transistor Q3 is coupled to its drain and the gate of the NMOS transistor Q2. The drain of the NMOS transistor Q3 receives the above-mentioned adding current Ia to correspondingly generate the current Id at the drain of the NMOS transistor Q2.

The operation principle of the current feedback circuit 310 is as follows. When the error voltage Verr is larger than the reference voltage Vref, it represents the voltage drop of the resistor R1 generated as the drain current Id flows by is too low, that is, the drain current Id is too low. Therefore, the operational amplifier 312 increases the output reference current Iref in order to magnify the adding current Ia. The drain current Id increases along with the adding current Ia to be substantially equal to a constant value K under the structure of current mirror 320. When the error voltage Verr is smaller than the reference voltage Vref, it represents the voltage drop of the resistor R1 generated as the drain current Id flows by is too large, that is, the drain current Id is too large. The operational amplifier 312 reduces the output reference voltage Vref to lower down the adding current Ia. Therefore, the drain current Id can be reduced accordingly to be substantially equal to the constant value K.

In the embodiment, the value of resistor R1 can be very small and thus the voltage drop of resistor R1 caused by the drain current Id becomes very small. Therefore, the source follower 300 can remain a normal operation as provided with a small-value operational voltage. The small-value operational voltage can be smaller than a normal operational voltage (5.0 or 3.3 voltage).

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A current feedback circuit, applied in a source follower, the source follower comprising a transistor having a first electrode, a second electrode, and a third electrode, the first electrode receiving an input signal, the second electrode outputting an output signal according to the input signal, a current of the source follower flowing through the transistor, the current feedback circuit comprising:
   a first impedance, coupling to the third electrode to form a node, wherein the current of the source follower flows through the first impedance and the node outputs an error voltage;
   a comparator, coupled to the first impedance, for outputting a reference current according to the error voltage and a reference voltage; and
   an adder, for adding an active current and the reference current and thereby outputting an added current;
   wherein the source follower comprises:
      a current source, for generating the active current; and
      a current mirror, coupled to the adder and the transistor, for controlling the current of the source follower according to the added current.

2. The circuit of claim 1, further comprising:
   a reference voltage generator, for generating the reference voltage.

3. The circuit of claim 2, wherein the reference voltage generator further comprises:
   a second impedance coupled to a current source to form a second node, the second node outputs the reference voltage.

4. The circuit of claim 1, wherein the comparator comprises an operational amplifier.

5. A source follower, comprising:
   a transistor, comprising a first electrode, a second electrode, and a third electrode, wherein the first electrode receives an input signal, the second electrode outputs an output signal according to the input signal, and a drain current flows by the transistor;
   an impedance, coupled to the third electrode to form a first node, wherein the drain current flows through the impedance and the first node outputs an error voltage which is corresponding to the drain current;
   a comparator, coupled to the impedance for comparing the error voltage with a reference voltage and thereby outputting a reference current; and a feedback circuit, comprising:
  a current source, for outputting an active current;
  an adder, coupled to the comparator and the current source, for adding the reference current and the active current to output an added current; and
  a current mirror, coupled to the adder and the transistor, for controlling the drain current according to the added current.

6. The source follower of claim 5, further comprising:
a reference voltage generating circuit, for generating the reference voltage.

7. The source follower of claim 6, wherein the reference voltage generating circuit further comprises:
  a design impedance, coupled to a voltage source and the comparator, wherein a design current flows by the design impedance and one end of the design impedance coupled to the comparator has the reference voltage;
  wherein the reference voltage varies along with the design impedance and the design current.

8. The source follower of claim 7, wherein the comparator is an operational amplifier.

9. A method for receiving an input signal and thereby outputting an output signal, the method comprising:
  receiving the input signal by a gate of a transistor, and thereby outputting the output signal according to the input signal by a source of the transistor, wherein a drain current flows through the transistor;
  generating an error voltage which is corresponding to the drain current and an impendence;
  comparing the error voltage with a reference voltage and thereby outputting a reference signal;
  providing an active signal;
  outputting a control signal according to the active signal and the reference signal; and
  mirroring the control signal and thereby controlling the drain current.

10. The method of claim 9, wherein the reference signal, the active signal and the control signal are current signals.

11. The method of claim 9, wherein the step of outputting the control signal comprises a step of adding the reference signal and the active signal to output the control signal.

12. The circuit of claim 1, wherein the adder is an adding node.

13. The source follower of claim 5, wherein the adder is an adding node.

* * * * *